(12) United States Patent
Wang

(10) Patent No.: US 11,355,622 B2
(45) Date of Patent: Jun. 7, 2022

(54) SEMICONDUCTOR DEVICE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/029,353

(22) Filed: Sep. 23, 2020

(65) Prior Publication Data

US 2021/0167185 A1 Jun. 3, 2021

(30) Foreign Application Priority Data

Nov. 28, 2019 (CN) .......................... 201911190450.0

(51) Int. Cl.
| | |
|---|---|
| H01L 29/66 | (2006.01) |
| H01L 21/8234 | (2006.01) |
| H01L 29/78 | (2006.01) |
| H01L 29/417 | (2006.01) |

(52) U.S. Cl.
CPC .. *H01L 29/6681* (2013.01); *H01L 21/823431* (2013.01); *H01L 29/41791* (2013.01); *H01L 29/785* (2013.01)

(58) Field of Classification Search
CPC ............. H01L 29/41791; H01L 29/785; H01L 29/42392; H01L 21/823431; H01L 2029/7858; H01L 29/0653
See application file for complete search history.

(56) References Cited

U.S. PATENT DOCUMENTS

2020/0294866 A1* 9/2020 Cheng ................. H01L 29/0673

* cited by examiner

*Primary Examiner* — Changhyun Yi
(74) *Attorney, Agent, or Firm* — Anova Law Group, PLLC

(57) ABSTRACT

A semiconductor device and a method for forming the semiconductor device are provided. The method includes providing a substrate, sequentially forming at least two sacrificial layers on the substrate, and forming a liner layer between any adjacent sacrificial layers of the at least two sacrificial layers. The method also includes forming a hard mask layer on a top layer of the at least two sacrificial layers, and sequentially etching the hard mask layer, the at least two sacrificial layers, the liner layer, and a portion of the substrate, thereby forming a plurality of fins that are discretely arranged on a remaining portion of the substrate. The method also includes forming a dummy gate structure across the plurality of fins on the remaining portion of the substrate, and removing a portion of the at least two sacrificial layers under the dummy gate structure, thereby forming tunnels.

20 Claims, 19 Drawing Sheets

SEMICONDUCTOR DEVICE AND FORMATION METHOD THEREOF

CROSS-REFERENCE TO RELATED APPLICATION

This application claims priority of Chinese Patent Application No. 201911190450.0, filed on Nov. 28, 2019, the entire content of which is hereby incorporated by reference.

FIELD OF THE DISCLOSURE

The present disclosure generally relates to the field of semiconductor manufacturing technology and, more particularly, relates to semiconductor devices and formation methods thereof.

BACKGROUND

With rapid development of semiconductor manufacturing technology, semiconductor devices are developed in a direction of higher component densities and higher integration levels. A conventional planar semiconductor device may have weak control over channel current, and a short-channel effect may occur, resulting in leakage current. Accordingly, electrical performance of the semiconductor device may be affected.

To overcome the short-channel effect of a semiconductor device and suppress the leakage current, fin field effect transistors (FinFETs) are proposed by existing technologies. A FinFET is a common multi-gate device. A FinFET may include fins and isolation structures on a surface of a semiconductor substrate, gate structures on the substrate and across the fins, and source regions and drain regions in each of the fins on two sides of the gate structures. The isolation structures may cover a portion of sidewalls of the fins.

With higher requirements continuously demanded for device performance, a gate-all-around structure having current control on all four sides has emerged. A semiconductor device with a gate-all-around structure may effectively suppress the short-channel effect, and may be what the industry is eager for following Moore's Law, in order to continuously shrink device sizes. A device channel formed by a thin silicon film in a gate-all-around structure may be surrounded by a gate of the device, and may be controlled only by the gate.

Forming a gate-all-around structure to improve performance of semiconductor devices is an urgent challenge to be addressed. The disclosed structures and methods are directed to solve one or more problems set forth above and other problems in the art.

BRIEF SUMMARY OF THE DISCLOSURE

One aspect of the present disclosure includes a method for forming a semiconductor device. The method includes providing a substrate, sequentially forming at least two sacrificial layers on the substrate, and forming a liner layer between any adjacent sacrificial layers of the at least two sacrificial layers. The method also includes forming a hard mask layer on a top layer of the at least two sacrificial layers, and sequentially etching the hard mask layer, the at least two sacrificial layers, the liner layer, and a portion of the substrate, thereby forming a plurality of fins that are discretely arranged on a remaining portion of the substrate. The method also includes forming a dummy gate structure across the plurality of fins on the remaining portion of the substrate, and removing a portion of the at least two sacrificial layers under the dummy gate structure, thereby forming tunnels.

Optionally, the hard mask layer is made of a material including silicon nitride, silicon oxide, silicon oxynitride, silicon carbide, silicon carbonitride, or a combination thereof.

Optionally, the hard mask layer is formed by a chemical vapor deposition process, an atomic layer deposition process, a physical vapor deposition process, or a combination thereof.

Optionally, the at least two sacrificial layers are made of a material including silicon, germanium, silicon germanium, gallium arsenide, or a combination thereof.

Optionally, the liner layer is made of a material including silicon, germanium, silicon germanium, gallium arsenide, or a combination thereof.

Optionally, after forming the dummy gate structure and before removing the at least two sacrificial layers, the method also includes etching the plurality of fins on two sides of the dummy gate structure by using a first etching process, thereby forming first grooves in each of the plurality of fins, and forming doped source/drain layers in the first grooves.

Optionally, before forming the doped source/drain layers, the method also includes forming sidewall spacers on sidewalls of the dummy gate structure.

Optionally, after forming the first grooves and before forming the doped source/drain layers, the method also includes etching a portion of the at least two sacrificial layers covered by the sidewall spacers by using a second etching process, thereby forming second grooves in the at least two sacrificial layers.

Optionally, the method also includes forming inner walls in the second grooves.

Optionally, the second etching process includes a wet etching process.

Optionally, the first etching process includes a dry etching process.

Optionally, removing the portion of the at least two sacrificial layers under the dummy gate structure includes removing the dummy gate structure, and removing the portion of the at least two sacrificial layers under the dummy gate structure.

Optionally, before removing the portion of the at least two sacrificial layers under the dummy gate structure, the method also includes performing ion implantation processing on the remaining portion of the substrate.

Optionally, before removing the dummy gate structure, the method also includes forming a dielectric layer on the remaining portion of the substrate. The dielectric layer covers the doped source/drain layers, and a top surface of the dielectric layer is flush with a top surface of the dummy gate structure.

Optionally, after forming the tunnels, the method also includes forming a metal gate structure on the remaining portion of the substrate. The metal gate structure fills the tunnels, and the metal gate structure surrounds the liner layer and the hard mask layer.

Another aspect of the present disclosure includes a semiconductor device. The semiconductor device includes a substrate, and a plurality of fins discretely arranged on the substrate. Each fin of the plurality of fins includes a metal gate structure and a plurality of layers. The metal gate structure is formed between adjacent layers of the plurality of layers and surrounds each layer of the plurality of layers. The plurality of layers includes one or more liner layers and a hard mask layer formed over the one or more liner layers.

The semiconductor device also includes doped source/drain layers, formed in each fin and on sidewalls of the one or more liner layers and the hard mask layer.

Optionally, the semiconductor device also includes a dielectric layer formed over the doped source/drain layers. A portion of the metal gate structure is formed through the dielectric layer and over the hard mask layer.

Optionally, the semiconductor device also includes a sidewall spacer, formed over the hard mask layer and between the dielectric layer and the portion of the metal gate structure over the hard mask layer. A top surface of the sidewall spacer is flush with a top surface of the metal gate structure.

Optionally, the semiconductor device also includes an isolation structure, formed on the substrate and covering a portion of sidewalls of the plurality of fins.

Optionally, the semiconductor device also includes inner walls, formed between the doped source/drain layers and portions of the metal gate structure in a direction parallel with a top surface of the substrate.

As disclosed, the technical solutions of the present disclosure have the following advantages.

At least two sacrificial layers are sequentially formed on a substrate, and a liner layer is formed between any adjacent sacrificial layers of the at least two sacrificial layers. A hard mask layer is formed on a top layer of the at least two sacrificial layers. The hard mask layer, the at least two sacrificial layers, the liner layer, and a portion of the substrate are then etched sequentially, thereby forming fins. A dummy gate structure across the fins may be formed on the substrate. Tunnels may be formed after a portion of the at least two sacrificial layers under the dummy gate structure is removed. In this way, on one hand, when the dummy gate structure is removed and a metal gate structure is formed, the metal gate structure may fill the tunnels, and a gate-all-around structure surrounding the liner layer may thus be formed. Accordingly, an effective length and control ability of the metal gate structure may be improved.

On the other hand, after the portion of the at least two sacrificial layers under the dummy gate structure is removed, the metal gate structure may be formed, thereby forming channels in the semiconductor device. The channels include a top channel and a non-top channel. The top channel is formed with the hard mask layer, and is a dummy channel. That is, when the semiconductor device is powered on, the hard mask layer is always in a closed state, and electric current may not flow in the hard mask layer. Thus, the top channel may not exhibit electrical performance, and overall electrical performance of the channels may be exhibited only by the non-top channel. The non-top channel is formed with the liner layer. Since consistency of electrical performance of the non-top channel may be ensured when the semiconductor device is powered on, the overall electrical performance of the channels in the semiconductor device may be controllable. Accordingly, performance and quality of the semiconductor device formed may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

FIGS. 1 to 7 illustrate schematics of semiconductor structures corresponding to certain stages of a method for forming a semiconductor device.

Figure 1:
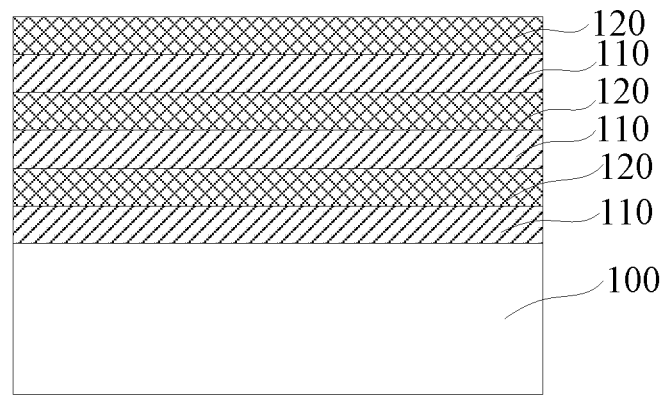
FIGS. 1 to 7 illustrate schematics of semiconductor structures corresponding to certain stages of a process for forming a semiconductor device.

Referring to FIG. 1, a substrate 100 is provided. Sacrificial layers 110 and liner layers 120 are alternately formed on the substrate 100 in sequence. A total of three sacrificial layers 110 and three liner layers 120 are formed.

Figure 2:
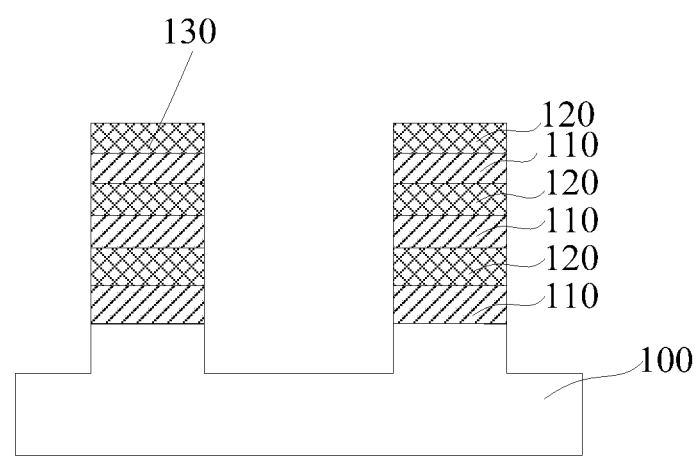

Referring to FIG. 2, the liner layers 120, the sacrificial layers 110 and a partial thickness of the substrate 100 are sequentially etched, and fins 130 discretely arranged on the substrate 100 may thus be formed.

Figure 3:
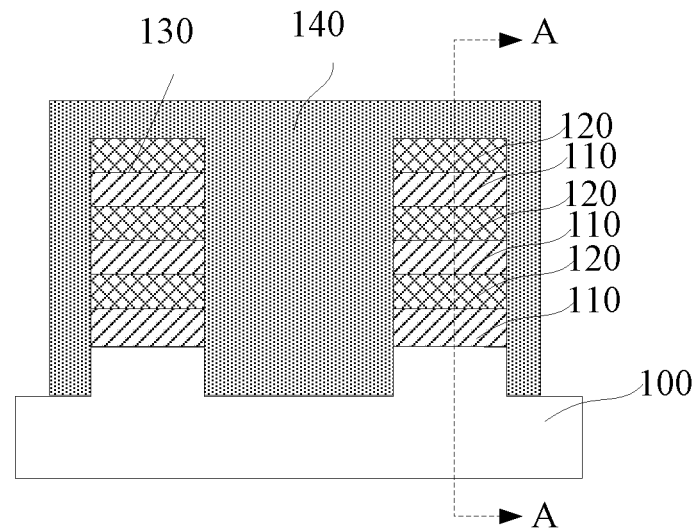
Figure 4:
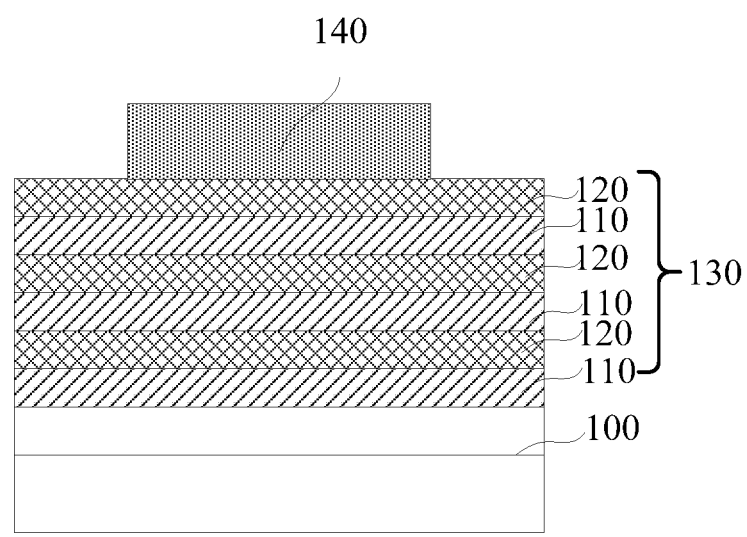

Referring to FIGS. 3 to 4, a dummy gate structure 140 spanning the fins 130 is formed on the substrate 100. FIG. 4 is a cross-sectional view of FIG. 3 along the line A-A.

Figure 5:
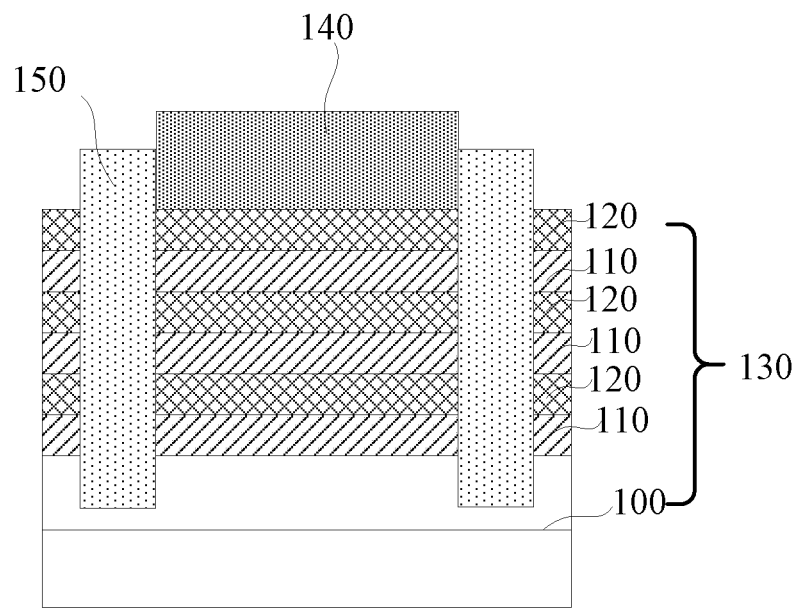

Referring to FIG. 5, grooves (not shown in the figure) are formed in the fins 130 on two sides of the dummy gate structure 140, and doped source/drain layers 150 are formed in the grooves.

Figure 6:
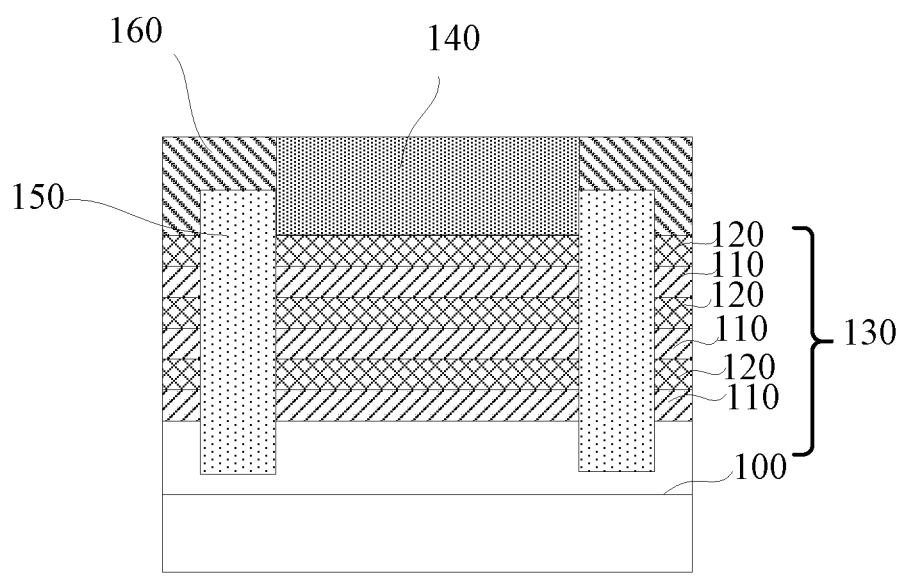

Referring to FIG. 6, a dielectric layer 160 is formed on the substrate 100. The dielectric layer 160 covers the doped source/drain layers 150, and a top surface of the dielectric layer 160 is flush with a top surface of the dummy gate structure 140.

Figure 7:
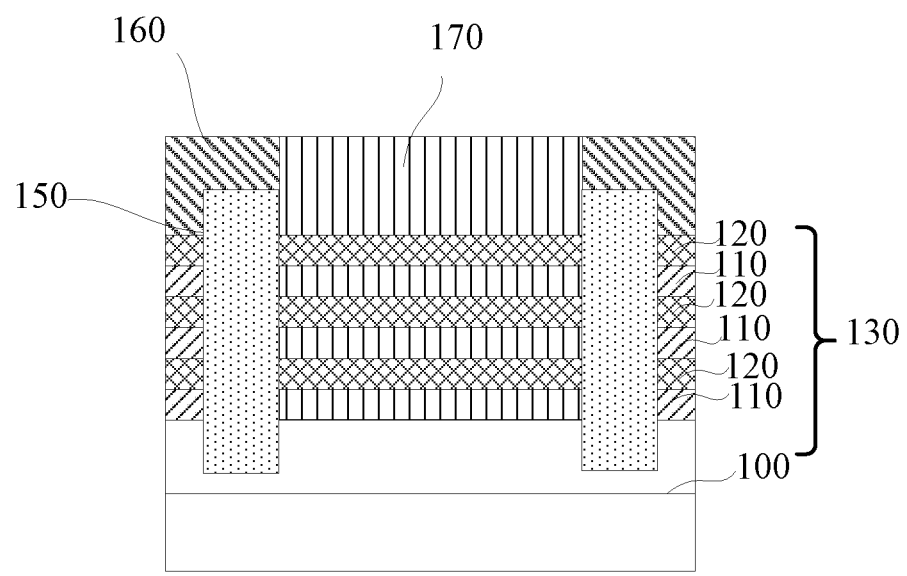

Referring to FIG. 7, the dummy gate structure 140 and the sacrificial layers 110 under the dummy gate structure are removed, and a metal gate structure 170 is formed on the substrate 100. The metal gate structure 170 surrounds the liner layers 120. The dielectric layer 160 is then removed.

The inventors of the present disclosure have found that a semiconductor device formed by the method described above may have undesirable performance. Electrical performance of the top channel may be quite different from electrical performance of the non-top channels. On and off currents of the top channel may be inconsistent with on and off currents of the non-top channels. Accordingly, the electrical performance of the semiconductor device may be uncontrollable, and application performance of the semiconductor device may thus be compromised.

The inventors of the present disclosure have found through research that a hard mask layer may be used as a top channel. When the semiconductor device is powered on, since the hard mask layer is a non-semiconductor layer, the top channel may be always in a closed state, and thus the top channel may not exhibit electrical performance. Accordingly, electrical performance different from the electrical performance of the non-top channels may not be exhibited by the top channel, and consistency of channel electrical performance of the semiconductor device formed may thus be improved. As such, the electrical performance of the semiconductor device may be controllable, and quality and application performance of the semiconductor device may thus be improved.

Figure 35:
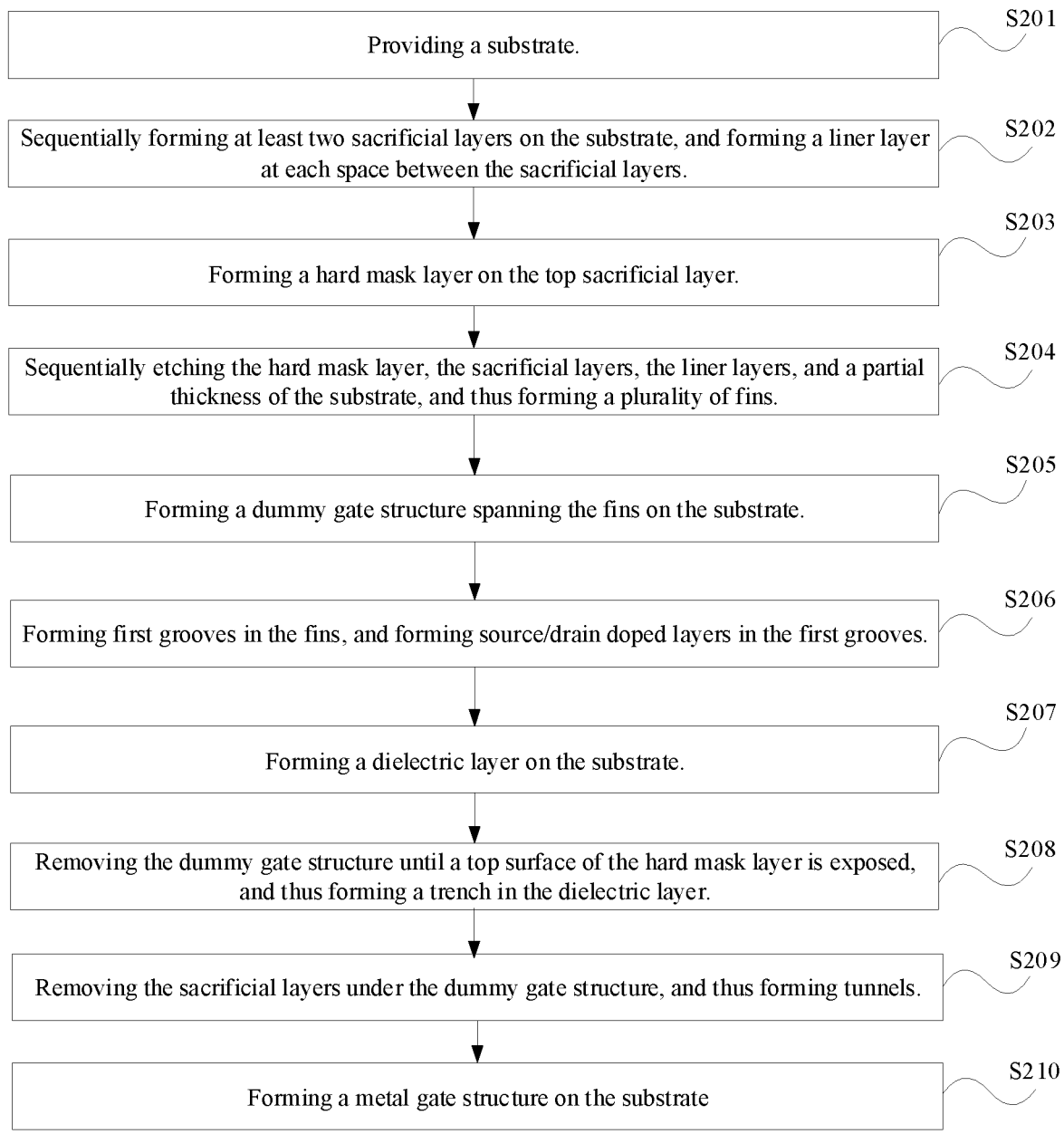
FIG. 35 illustrates an exemplary process for forming a semiconductor device consistent with the disclosed embodiments of the present disclosure.

FIG. 35 illustrates an exemplary process for forming a semiconductor device consistent with the disclosed embodiments of the present disclosure. FIGS. 8 to 21 illustrate schematics of semiconductor structures corresponding to certain stages of the exemplary process for forming a semiconductor device consistent with the disclosed embodiments of the present disclosure.

Figure 8:
FIGS. 8 to 21 illustrate schematics of semiconductor structures corresponding to certain stages of an exemplary process for forming a semiconductor device consistent with the disclosed embodiments of the present disclosure.

As shown in FIG. 35, at the beginning of the forming process, a substrate is provided (S201). FIG. 8 illustrates a corresponding semiconductor structure.

Referring to FIG. 8, a substrate 200 is provided. In one embodiment, the substrate 200 is made of monocrystalline silicon. In some other embodiments, the substrate 200 may be made of monocrystalline silicon, polycrystalline silicon or amorphous silicon. The substrate 200 may also be made of a semiconductor material, including silicon, germanium, silicon germanium, and gallium arsenide.

Figure 9:
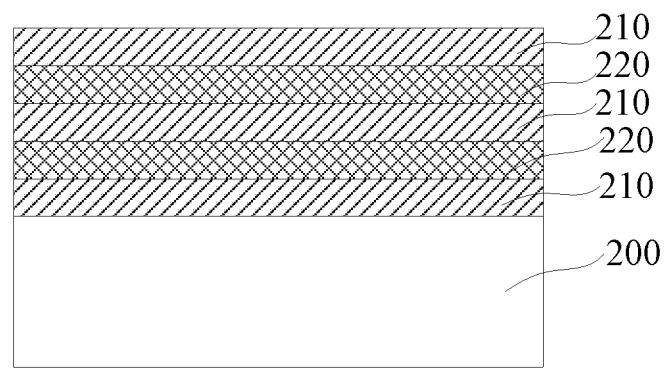

Returning to FIG. 35, after the substrate 200 is provided, at least two sacrificial layers may be sequentially formed on the substrate, and a liner layer may be formed at each space between the sacrificial layers (S202). FIG. 9 illustrates a corresponding semiconductor structure.

Referring to FIG. 9, at least two sacrificial layers 210 are sequentially formed on the substrate 200, and a liner layer 220 is formed at each space between the sacrificial layers 210.

In one embodiment, the sacrificial layers 210 are made of silicon germanium. In some other embodiments, the sacrificial layers 210 may be made of one or more of materials including silicon, germanium, or gallium arsenide.

In one embodiment, the liner layer 220 is made of silicon. In some other embodiments, the liner layer 220 may be made of one or more of materials including germanium, silicon germanium, or gallium arsenide.

In one embodiment, three sacrificial layers 210 and two liner layers 220 are formed on the substrate 200. The liner layers 220 are located between the sacrificial layers 210.

In one embodiment, the sacrificial layers 210 and the liner layers 220 are formed on the substrate 200 by an epitaxial growth process. In some other embodiments, the sacrificial layers 210 and the liner layers 220 may also be formed on the substrate 200 by ion doping or chemical vapor deposition.

In one embodiment, an epitaxial growth process for forming the sacrificial layers 210 include following processing parameters. Silane ($SiH_4$) and germane ($GeH_4$) are used as an ambient atmosphere. Gas percentage ratios of silane ($SiH_4$) and germane ($GeH_4$) are controlled in a range of approximately 20% to 50%. A reaction pressure is controlled in a range of approximately 1 Torr to 100 Torr, and a reaction temperature is controlled in a range of approximately 400° C. to 600° C. A reaction time is controlled in a range of approximately 10 minutes to one hour.

In one embodiment, an epitaxial growth process for forming the liners layer 220 include following processing parameters. Silane ($SiH_4$) gas is used as an ambient atmosphere, and a flow rate of the $SiH_4$ gas is in a range of approximately 10 sccm to 700 sccm. A reaction pressure is in a range of approximately 1 Torr to 100 Torr, and a reaction temperature is in a range of approximately 400° C. to 600° C. A reaction time is controlled in a range of approximately 10 minutes to one hour.

Figure 10:
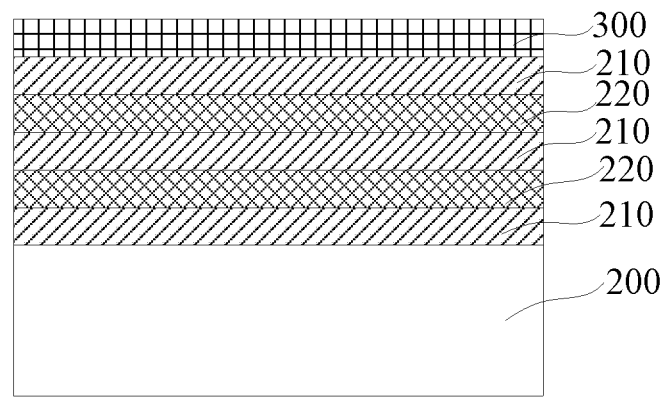

Returning to FIG. 35, after the sacrificial layers and liner layers are formed, a hard mask layer may be formed on the top sacrificial layer (S203). FIG. 10 illustrates a corresponding semiconductor structure.

Referring to FIG. 10, a hard mask layer 300 is formed on the top sacrificial layer 210. In one embodiment, the hard mask layer 300 is made of silicon nitride. In some other embodiments, the hard mask layer 300 may also be made of silicon oxide, silicon oxynitride, silicon carbide, or silicon carbonitride.

In one embodiment, the hard mask layer 300 is formed by a chemical vapor deposition process. In some other embodiments, the hard mask layer 300 may also be formed by an atomic layer deposition process or a physical vapor deposition process.

In one embodiment, the hard mask layer 300 formed may be used as a top channel. Since the hard mask layer 300 is made of a non-semiconductor material, when the semiconductor device is powered on, the top channel may be always in a closed state. Accordingly, during a working procedure of the semiconductor device, the top channel may not exhibit electrical performance. As such, when the semiconductor device is powered on, the top channel may not exhibit electrical performance that is different from electrical performance of the non-top channels, and consistency of electrical performance of the channels of the semiconductor device may thus be improved.

Figure 11:
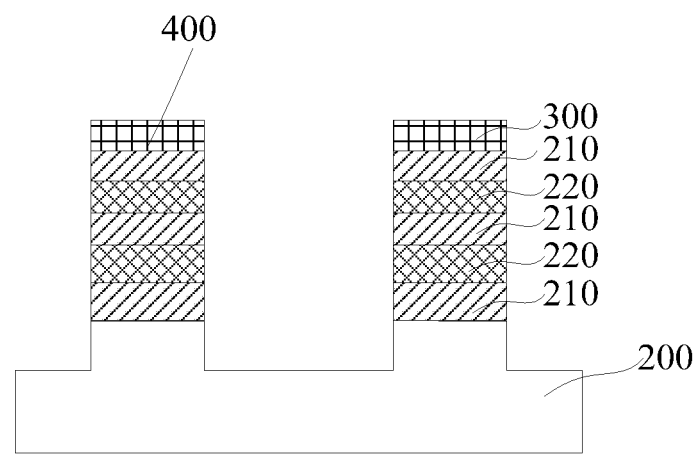

Returning to FIG. 35, after the hard mask layer is formed, the hard mask layer, the sacrificial layers, the liner layers, and a partial thickness of the substrate may be sequentially etched, and a plurality of fins that are discretely arranged may thus be formed on the substrate (S204). FIG. 11 illustrates a corresponding semiconductor structure.

Referring to FIG. 11, the hard mask layer 300, the sacrificial layers 210, the liner layers 220, and a partial thickness of the substrate 200 are sequentially etched, and a plurality of fins 400 that are discretely arranged is formed on the substrate 200.

In one embodiment, the fins 400 are formed by a dry etching process. In some other embodiments, the fins 400 may also be formed by a wet etching process. In one embodiment, the dry etching process include following processing parameters. Etching gases used include HBr and Ar. A flow rate of HBr is in a range of approximately 10 sccm to 1,000 sccm, and a flow rate of Ar is in a range of approximately 10 sccm to 1,000 sccm.

Figure 12:
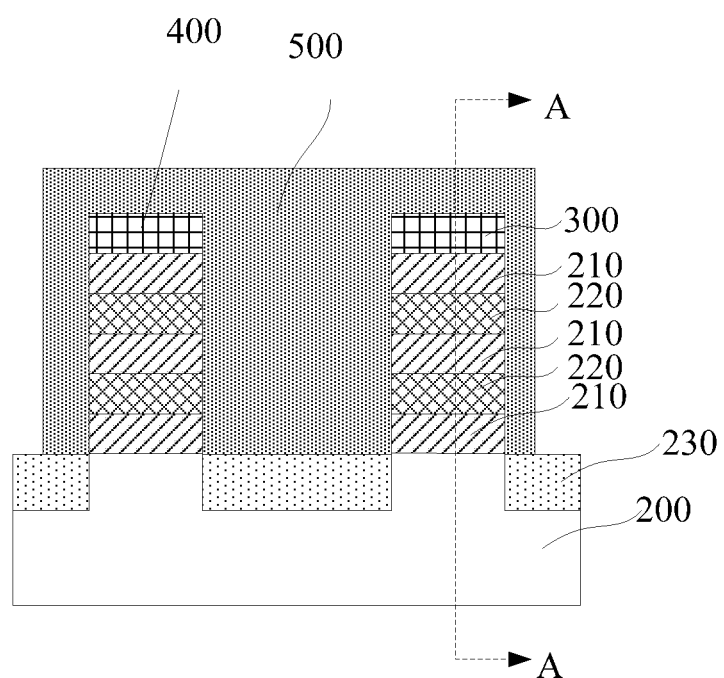
Figure 13:
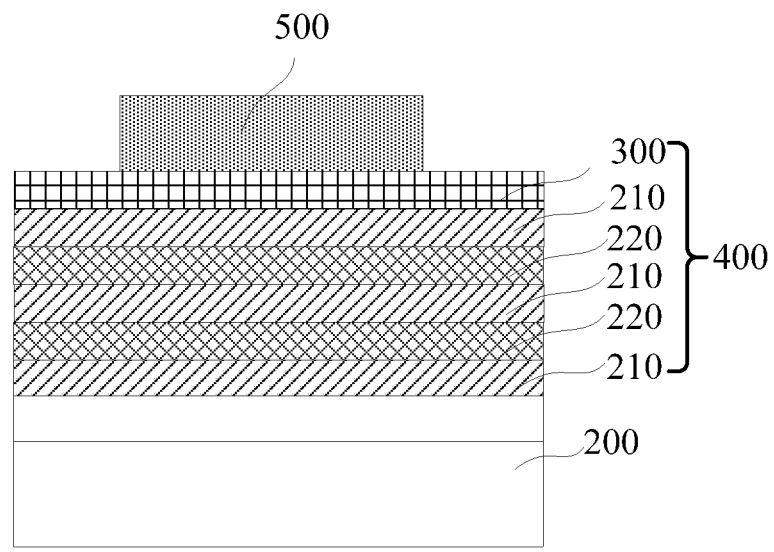

Returning to FIG. 35, after the fins are formed, a dummy gate structure spanning the fins may be formed on the substrate (S205). FIGS. 12 and 13 illustrate a corresponding semiconductor structure. FIG. 13 is a cross-sectional view of FIG. 12 along the line A-A.

Referring to FIGS. 12 to 13, a dummy gate structure 500 spanning the fins 400 is formed on the substrate 200. In one embodiment, before forming the dummy gate structure 500, an isolation structure 230 may be formed on the substrate 200. The isolation structure 230 covers a part of sidewalls of the fins 400. In some other embodiments, the isolation structure 230 may not be formed on the substrate 200.

In one embodiment, a process for forming the isolation structure 230 includes forming an isolation structure film (not shown in FIGS. 12 and 13) covering the fins 400 on the substrate 200, and etching back the isolation structure film to form the isolation structure 230.

A process for forming the isolation structure film includes a deposition process, such as a fluid chemical vapor deposition process. An isolation structure film formed by a fluid chemical vapor deposition process may have good filling performance.

The fluid chemical vapor deposition process used for forming the isolation structure film may include following steps: forming an isolation fluid layer on the substrate 200, and performing water vapor annealing to make the isolation fluid layer form the isolation structure film. A process of the water vapor annealing may include following parameters. Gases used include oxygen, ozone and gaseous water. An annealing temperature is in a range of approximately 350° C. to 750° C.

In one embodiment, a purpose of forming the isolation structure 230 is to prevent electric leakage between adjacent fins 400. The electric leakage between the fins 400 may affect performance of the semiconductor device.

In one embodiment, the dummy gate structure 500 includes a dummy gate dielectric layer (not shown in FIGS. 12 and 13) on the fins 400 and a dummy gate layer (not shown in FIGS. 12 and 13) on the dummy gate dielectric layer.

Figure 14:
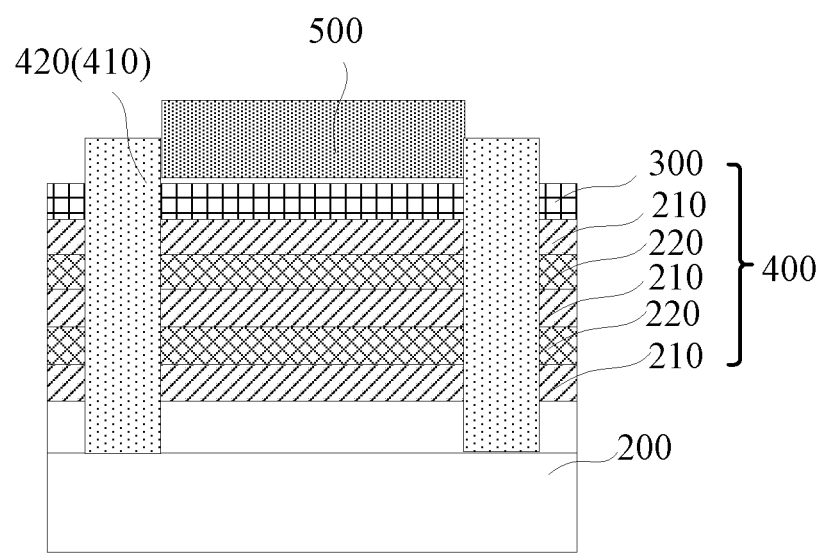

Returning to FIG. 35, after the dummy gate structure is formed, first grooves may be formed in the fins, and doped source/drain layers may be formed in the first grooves (S206). FIG. 14 illustrates a corresponding semiconductor structure.

Referring to FIG. 14, the first grooves 410 are formed in the fins 400 by etching the fins 400 on two sides of the dummy gate structure 500 using a first etching process, and doped source/drain layers 420 are formed in the first grooves 410.

In one embodiment, the first etching process is a dry etching process. In one embodiment, the first etching process includes following parameters. Etching gases used include HBr and Ar. A flow rate of HBr is in a range of approximately 10 sccm to 1,000 sccm, and a flow rate of Ar is in a range of approximately 10 sccm to 1,000 sccm.

In one embodiment, the doped source/drain layers 420 are formed in the first grooves 410 by an epitaxial growth process. In some other embodiments, the doped source/drain layers 420 may be formed by a chemical deposition process, a physical vapor deposition process or an atomic layer deposition process.

In one embodiment, the doped source/drain layers 420 are formed in the first grooves 410 by an epitaxial growth process. When the semiconductor device is a POMS device, the epitaxial growth process includes following processing parameters. A reaction process temperature is controlled in a range of approximately 500° C. to 800° C. A reaction pressure is controlled in a range of approximately 1 Torr to 100 Torr. A gas used includes a mixture of silane ($SiH_4$) and germanium hydrogen gas ($GeH_4$), and a gas flow is controlled in a range of approximately 70 sccm to 300 sccm. A reaction time is controlled in a range of approximately 3 seconds to 120 seconds.

In one embodiment, the doped source/drain layers 420 are formed in the first grooves 410 by an epitaxial growth process. When the semiconductor device is a NOMS device, the epitaxial growth process includes following processing parameters. A reaction temperature is controlled in a range of approximately 500° C. to 800° C. A reaction pressure is controlled in a range of approximately 1 Torr to 100 Torr. A gas used includes a mixture of silane ($SiH_4$) and phosphine gas ($PH_3$), and a gas flow is controlled in a range of approximately 70 sccm to 300 sccm. A reaction time is controlled in the range of approximately 3 seconds to 120 seconds.

Figure 15:
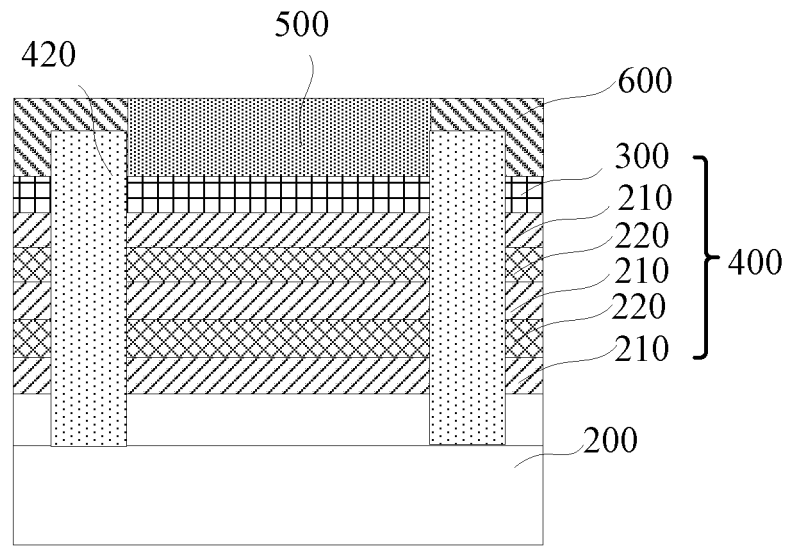

Returning to FIG. 35, after the doped source/drain layers are formed, a dielectric layer may be formed on the substrate (S207). FIG. 15 illustrates a corresponding semiconductor structure.

Referring to FIG. 15, a dielectric layer 600 is formed on the substrate 200. The dielectric layer 600 covers the doped source/drain layers 420. A top surface of the dielectric layer 600 is flush with a top surface of the dummy gate structure 500.

In one embodiment, the dielectric layer 600 is made of silicon carbide. In some other embodiments, the dielectric layer 600 may also be made of silicon oxide, silicon nitride, or the like.

In one embodiment, the dielectric layer 600 is formed by a chemical vapor deposition process. In some other embodiments, the dielectric layer 600 may also be formed by an atomic layer deposition process or a physical vapor deposition process.

In one embodiment, the dielectric layer 600 is formed by a chemical vapor deposition process. The chemical vapor deposition includes following processing parameters. Gases used includes hydrogen gas, HCl gas, $SiH_2Cl_2$ gas and $PH_3$ gas. A flow rate of the hydrogen gas is in a range of approximately 2,000 sccm to 20,000 sccm. A flow rate of the HCl gas is in a range of approximately 30 sccm to 150 sccm. A flow rate of the $SiH_2Cl_2$ gas is in a range of approximately 50 sccm to 1,000 sccm. A flow rate of the $PH_3$ gas is in a range of approximately 10 sccm to 2,000 sccm. A chamber pressure is in a range of approximately 10 Torr to 600 Torr, and a chamber temperature is in a range of approximately 650° C. to 850° C.

In one embodiment, after the dielectric layer 600 is formed by a chemical vapor deposition process, a chemical mechanical polishing process is used to planarize a surface of the dielectric layer 600, such that the top surface of the dielectric layer 600 is flush with the top surface of the dummy gate structure 500.

Figure 16:
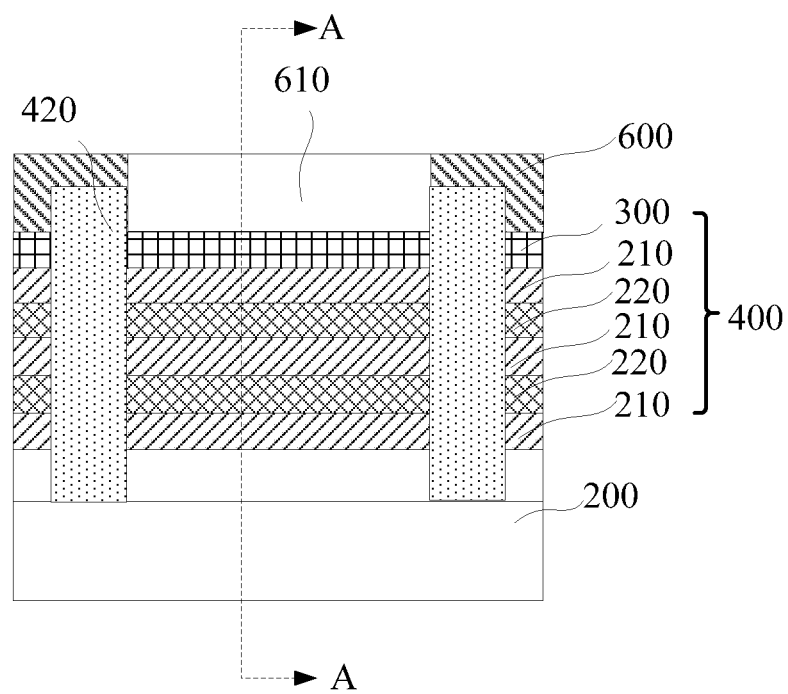
Figure 17:
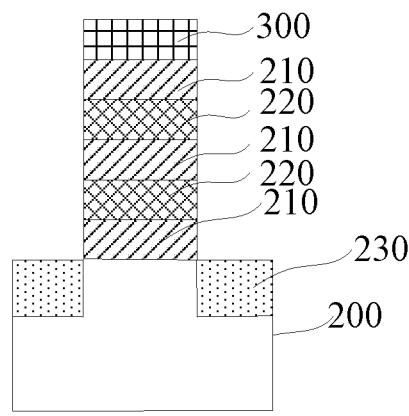

Returning to FIG. 35, after the dielectric layer is formed, the dummy gate structure may be removed until the top surface of the hard mask layer is exposed, and a trench may thus be formed in the dielectric layer (S208). FIGS. 16 to 17 illustrate a corresponding semiconductor structure. FIG. 17 is a cross-sectional view of FIG. 16 along the line A-A.

Referring FIGS. 16 to 17, the dummy gate structure 500 is removed until the top surface of the hard mask layer 300 is exposed, and a trench 610 is thus formed in the dielectric layer 600. In one embodiment, the dummy gate structure 500 is removed by a dry etching process, and an etching gas used is HBr gas. In some other embodiments, the etching gas may also be $SF_6$ gas.

Figure 18:
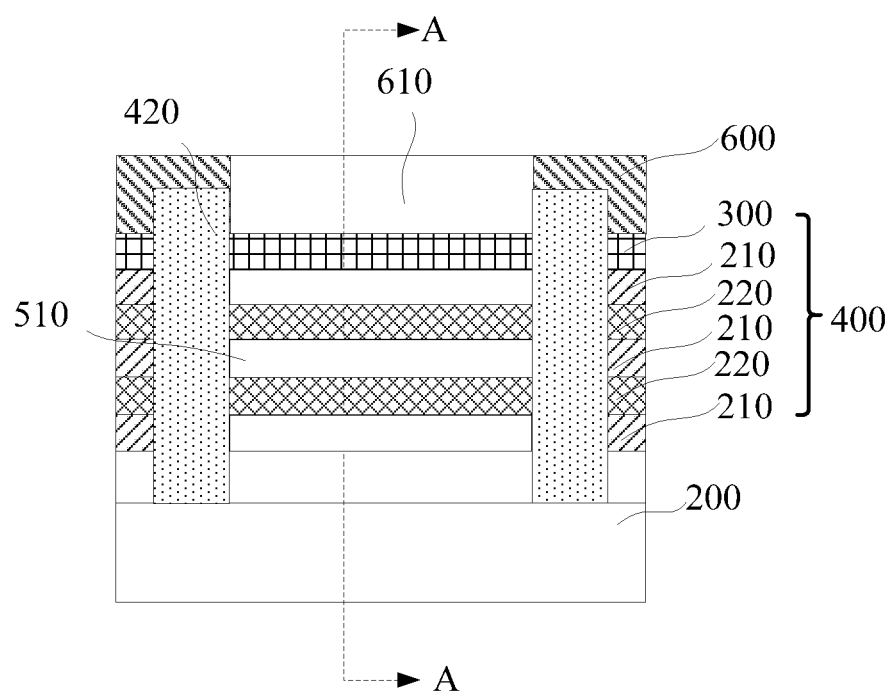
Figure 19:
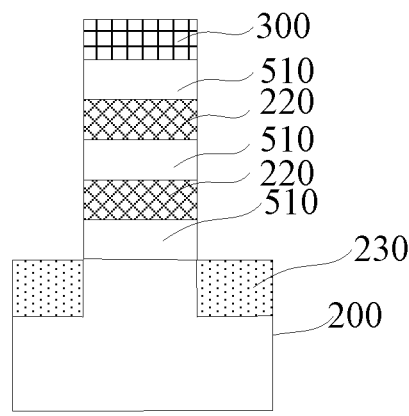

Returning to FIG. 35, after the trench is formed in the dielectric layer, the sacrificial layers under the dummy gate structure may be removed, and tunnels may thus be formed (S209). FIGS. 18 to 19 illustrate a corresponding semiconductor structure. FIG. 19 is a cross-sectional view of FIG. 18 along the line A-A.

Referring to FIGS. 18 to 19, the sacrificial layers 210 under the dummy gate structure 500 are removed, and tunnels 510 are thus formed. In one embodiment, the tunnels 510 are respectively located between the hard mask layer 300 and the liner layer 220, between adjacent liner layers 220, and between the liner layer 220 and the substrate 200.

In one embodiment, the sacrificial layers 210 are removed by an isotropic wet etching process. In some other embodiments, the sacrificial layers 210 may also be removed by a dry etching process, or the like.

In one embodiment, a wet etching solution used in the wet etching process is a HCl solution at a temperature in a range of approximately 25° C. to 300° C. A volume percentage of HCl gas in the HCl solution is in a range of approximately 20% to 90%.

In one embodiment, a purpose of forming the tunnels 510 includes that when a metal gate structure is subsequently formed, the metal gate structure may completely surround the liner layers 220, and gate-all-around structures may thus be formed. Accordingly, an effective length and control ability of the metal gate structure may be improved, and performance of the semiconductor device may thus be improved.

Figure 20:
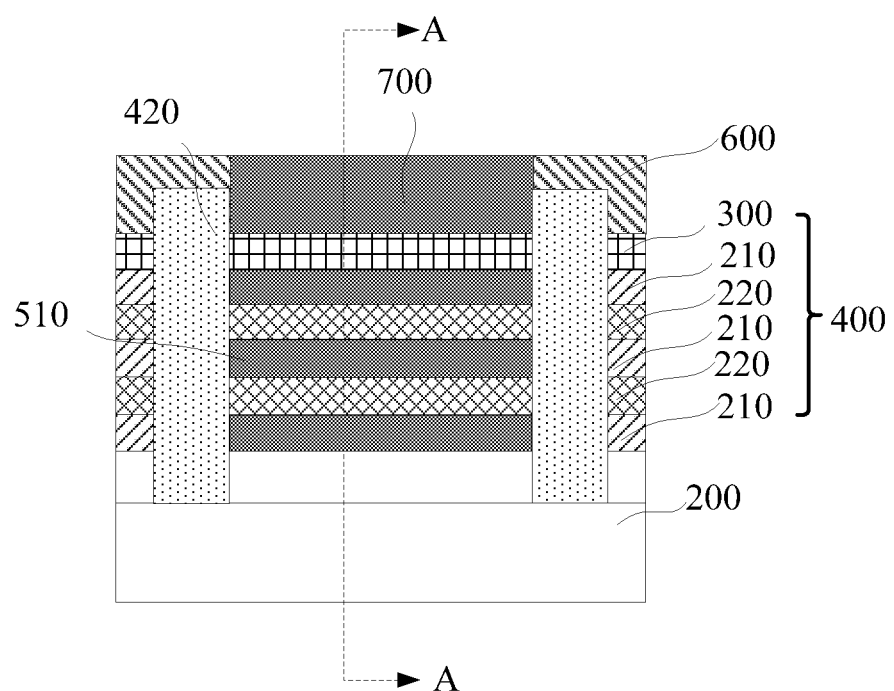
Figure 21:
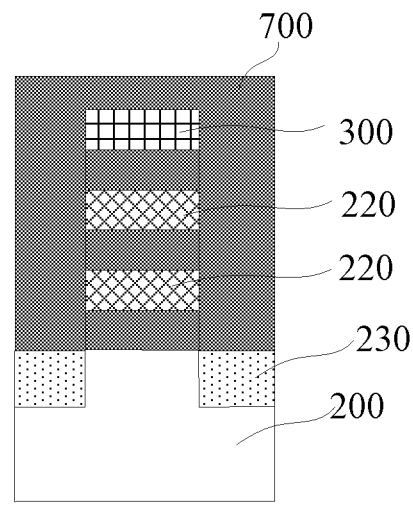

Returning to FIG. 35, after the tunnels are formed, a metal gate structure may be formed on the substrate (S210). FIGS. 20 to 21 illustrate a corresponding semiconductor structure. FIG. 21 is a cross-sectional view of FIG. 20 along the line A-A.

Referring to FIGS. 20 to 21, a metal gate structure 700 is formed on the substrate 200. The metal gate structure 700 surrounds the liner layers 220 and the hard mask layer 300.

In a semiconductor device, a channel refers to a semiconductor layer between a source region and a drain region. Electric current may flow in the semiconductor layer and may be controlled by a gate potential. The semiconductor device shown in FIGS. 20 and 21 includes a plurality of channels. The plurality of channels includes a top channel formed by the hard mask layer 300 and non-top channels formed by the liner layers 220. When the semiconductor device is working, since the hard mask layer 300 is a non-semiconductor layer, electric current may not flow in the top channel formed by the hard mask layer 300. Accordingly, the top channel may be always in a closed state, such that the top channel does not exhibit electrical performance. In this case, overall electrical performance of the plurality of channels may be exhibited by the non-top channels only. Since the non-top channels may have consistent electrical performance, consistency of the overall electrical performance of the plurality of channels may be improved. As such, the semiconductor device formed may have good performance-control ability, and formation quality of the semiconductor device may be improved.

In one embodiment, the metal gate structure 700 includes a gate dielectric layer (with a dielectric constant greater than approximately 3.9) and a metal gate layer on the gate dielectric layer.

The present disclosure also provides a semiconductor device. The semiconductor device includes a substrate 200 and a plurality of fins 400 arranged separately on the substrate 200. Each of the plurality of fins 400 includes at least two sacrificial layers 210 on the substrate 200, a liner layer 220 between the sacrificial layers 210, and a hard mask layer 300 on the top sacrificial layer. The semiconductor device also includes an isolation structure 230 located on the substrate 200 and covering a part of sidewalls of the fins 400, and a metal gate structure 700 located on the substrate 200 and spanning the plurality of fins 400. The semiconductor device also includes tunnels 510 under the metal gate structure 700. The tunnels 510 are located between the substrate 200 and the liner layer 220, between adjacent liner layers 220, and between the liner layer 220 and the hard mask layer 300. The metal gate structure 700 fills the tunnels 510 and surrounds the liner layers 220. The semiconductor device also includes first grooves 410 located in the fins 400 on two sides of the metal gate structure 700, and doped source/drain layers 420 filled in the first grooves 410. The semiconductor device also includes a dielectric layer 600 located on the substrate 200 and covering the doped source/drain layers 420. A top surface of the dielectric layer 600 is flush with a top surface of the metal gate structure 700.

Figure 36:
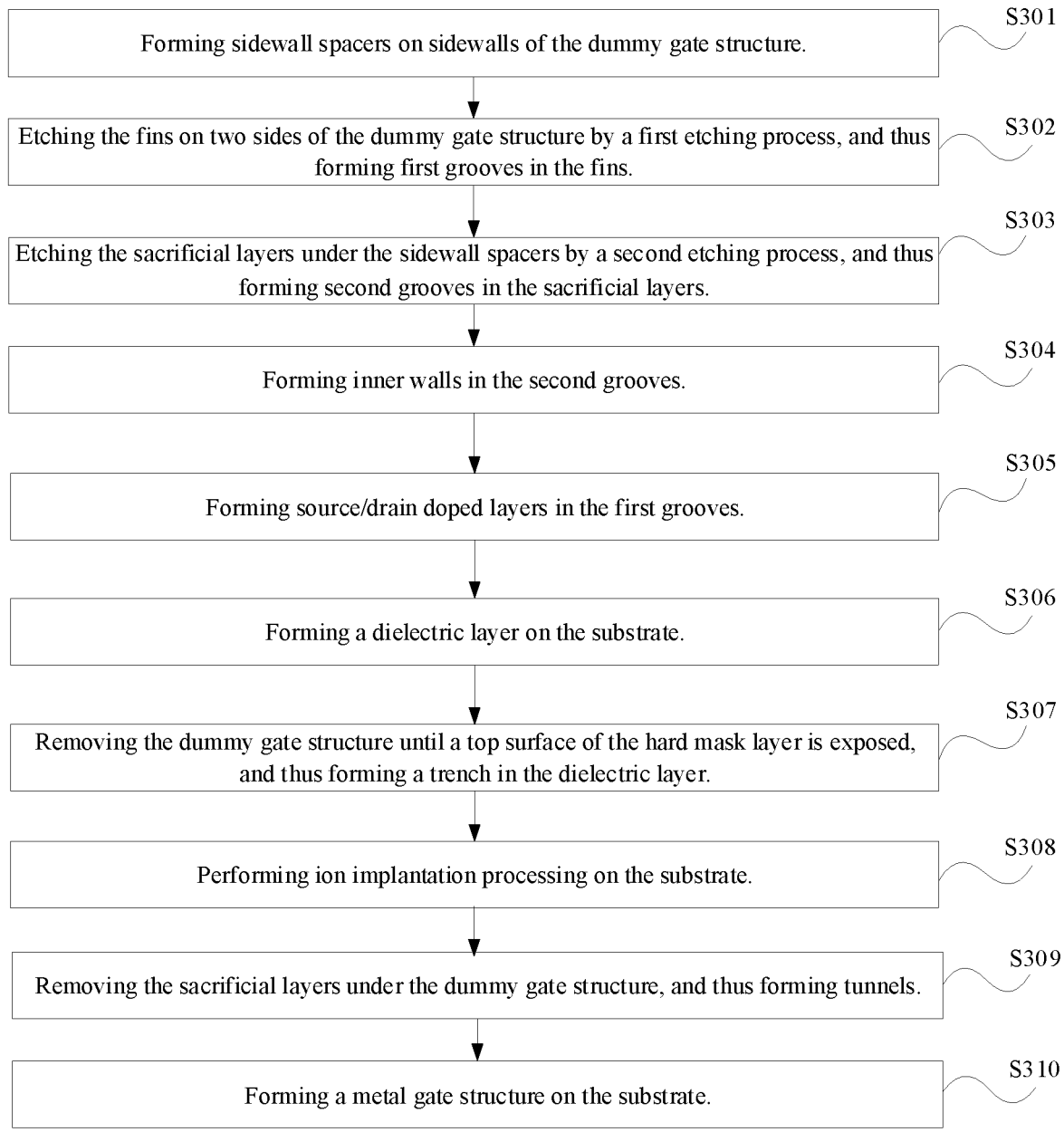
FIG. 36 illustrates another exemplary process for forming a semiconductor device consistent with the disclosed embodiments of the present disclosure.

FIG. 36 illustrates another exemplary process for forming a semiconductor device consistent with the disclosed embodiments of the present disclosure. FIGS. 22 to 34 illustrate schematics of semiconductor structures corresponding to certain stages of the exemplary process for forming the semiconductor device consistent with the disclosed embodiments of the present disclosure.

It should be noted the exemplary process illustrated in FIG. 36 starts from a dummy gate structure spanning fins on a substrate. A procedure from providing the substrate to forming the dummy gate structure spanning the fins on the substrate may include steps S201 to S205 as specified by the present disclosure. FIG. 8 to FIG. 13 illustrate schematics of semiconductor structures corresponding to steps S201 to S205.

Figure 22:
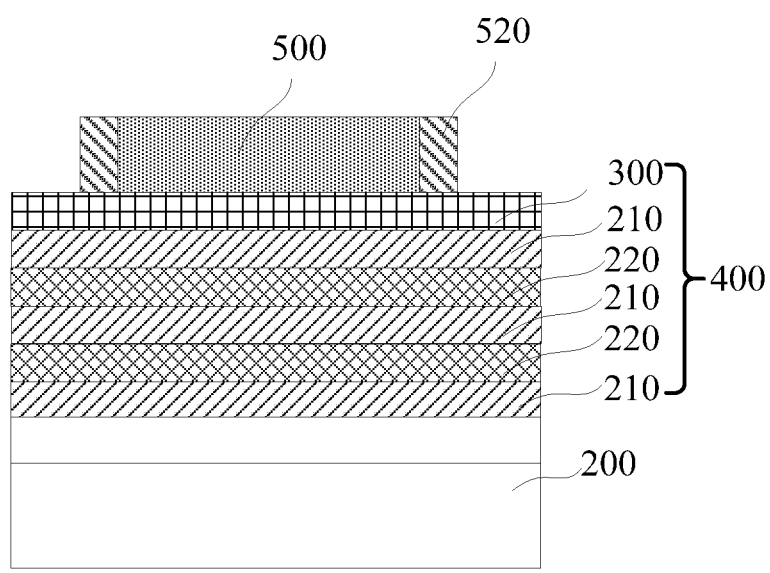
FIGS. 22 to 34 illustrate schematics of semiconductor structures corresponding to certain stages of another exemplary process for forming a semiconductor device consistent with the disclosed embodiments of the present disclosure.

Returning to FIG. 36, sidewall spacers may be formed on sidewalls of the dummy gate structure (S301). FIG. 22 illustrate a corresponding semiconductor structure.

Referring to FIG. 22, sidewall spacers 520 are formed on sidewalls of the dummy gate structure 500. In one embodiment, before the dummy gate structure 500 is formed, an isolation structure 230 may be formed on the substrate 200. The isolation structure 230 covers a part of the sidewalls of the fins 400. In some other embodiments, the isolation structure 230 may not be formed on the substrate 200.

In one embodiment, the sidewall spacers 520 are formed on the sidewalls of the dummy gate structure 500. In other embodiments, the sidewall spacers 520 may not be formed on the sidewalls of the dummy gate structure 500.

In one embodiment, the sidewall spacers 520 are made of silicon nitride. In some other embodiments, the sidewall spacers 520 may also be made of one or more of materials including silicon oxide, silicon nitride, silicon oxynitride, silicon oxycarbide, silicon carbonitride, or silicon oxycarbonitride. In one embodiment, a conventional process may be used to form the sidewall spacers 520.

In one embodiment, a purpose of forming the sidewall spacers 520 includes defining positions of doped source/drain layers to be formed subsequently, and protecting the sidewalls of the dummy gate structure 500. Accordingly, morphological defects of a metal gate structure 700 formed subsequently may be avoided. The morphological defects of the metal gate structure 700 may affect the electrical performance of the semiconductor device.

Figure 23:
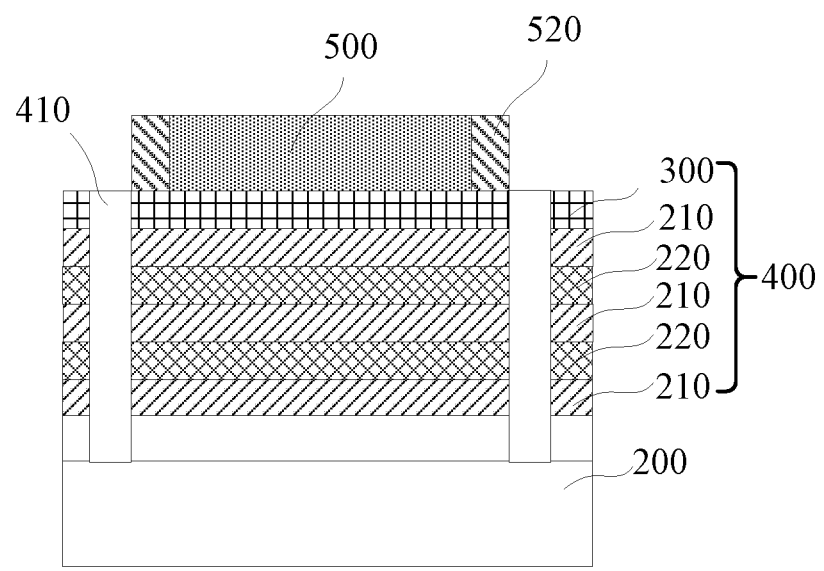

Returning to FIG. 36, after the sidewall spacers are formed, the fins on two sides of the dummy gate structure may be etched by a first etching process, and first grooves may thus be formed in the fins (S302). FIG. 23 illustrates a corresponding semiconductor structure.

Referring to FIG. 23, the fins 400 on two sides of the dummy gate structure 500 are etched by a first etching process, and first grooves 410 are thus formed in the fins 400.

In one embodiment, the fins 400 on two sides of the sidewall spacers 520 are etched, and the first grooves 410 are thus formed in the fin 400.

In one embodiment, the first etching process is a dry etching process. In one embodiment, the first etching process includes following parameters. Etching gases used include HBr and Ar. A flow rate of HBr is in a range of approximately 10 sccm to 1,000 sccm, and a flow rate of Ar is in a range of approximately 10 sccm to 1,000 sccm.

Figure 24:
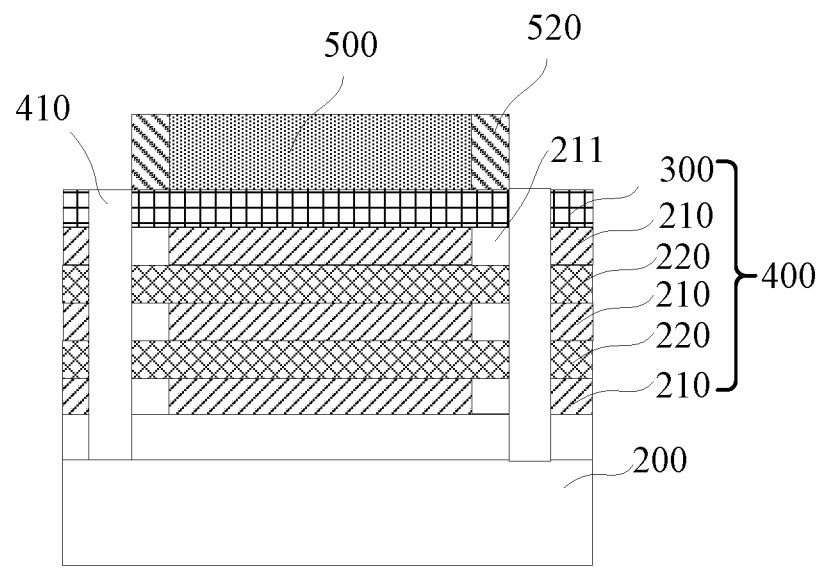

Returning to FIG. 36, after the first grooves are formed, the sacrificial layers under the sidewall spacers may be etched by a second etching process, and second grooves may thus be formed in the sacrificial layers (S303). FIG. 24 illustrates a corresponding semiconductor structure.

Referring to FIG. 24, the sacrificial layers 210 under the sidewall spacers 520 are etched by a second etching process, and second grooves 211 are thus formed in the sacrificial layers 210.

In one embodiment, the second etching process is a wet etching process. A wet etching solution used in the wet etching process may have a good selection ratio of silicon and silicon germanium. That is, in the wet etching process, morphology of silicon may not be affected while silicon germanium is removed.

In one embodiment, the wet etching process includes following parameters. An etching solution is a solution of HCl gas, and an etching temperature is in a range of approximately 25° C. to 300° C. A volume percentage of the HCl gas in the etching solution is in a range of approximately 20% to 90%.

Figure 25:
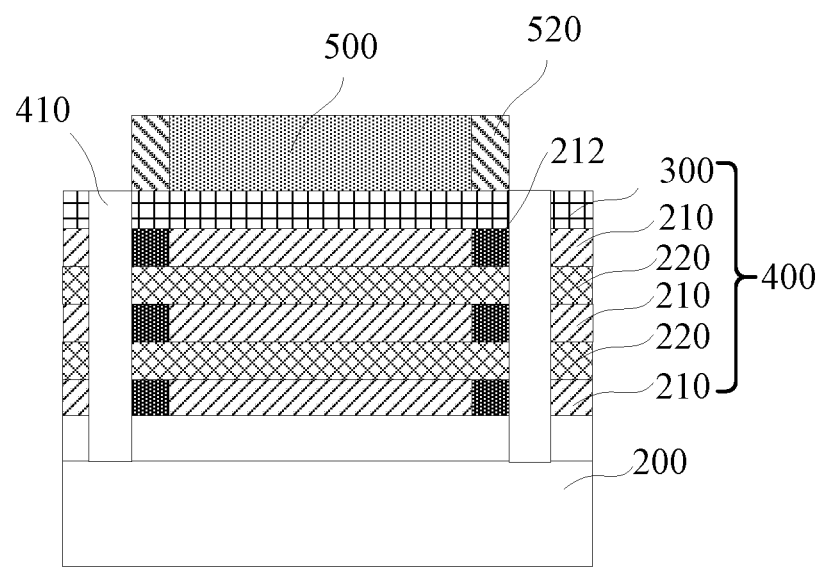

Returning to FIG. 36, after the second grooves are formed, inner walls may be formed in the second grooves (S304). FIG. 25 illustrates a corresponding semiconductor structure.

Referring to FIG. 25, inner walls 212 are formed in the second grooves 211. In one embodiment, the inner walls 212 are made of silicon nitride. In some other embodiments, the inner walls 212 may also be made of silicon oxide or silicon carbide.

In one embodiment, reasons and advantages of forming the inner walls 212 on the sidewalls of the remaining sacrificial layers 210 include that when a metal gate structure is formed subsequently, a distance between the metal gate structure and sources/drains may be increased, thus reducing parasitic capacitances.

Figure 26:
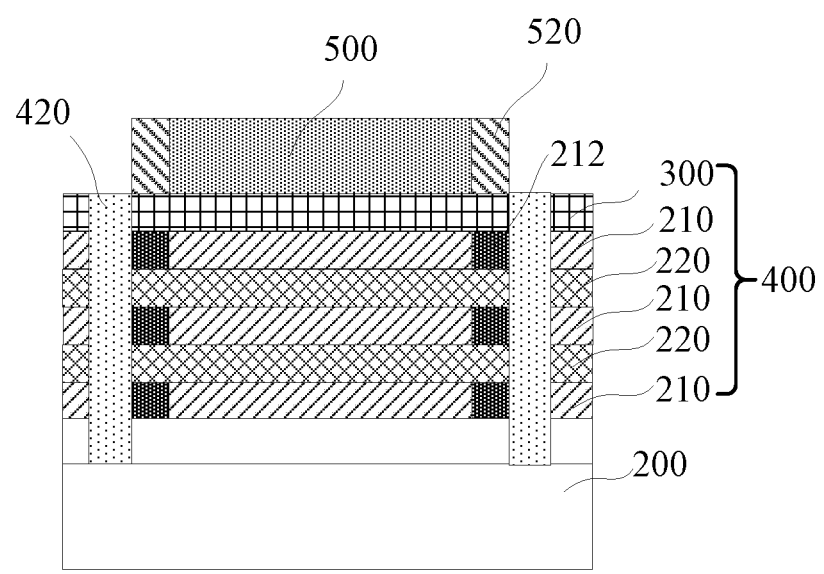

Returning to FIG. 36, after the inner walls are formed, doped source/drain layers may be formed in the first grooves (S305). FIG. 26 illustrates a corresponding semiconductor structure.

Referring to FIG. 26, the doped source/drain layers 420 are formed in the first grooves 410. In one embodiment, the doped source/drain layers 420 are formed in the first grooves 410 by an epitaxial growth process. In some other embodiments, the doped source/drain layers 420 may be formed by a chemical deposition process, a physical vapor deposition process or an atomic layer deposition process.

In one embodiment, the doped source/drain layers 420 are formed in the first grooves 410 by an epitaxial growth process. When the semiconductor device is a POMS device, the epitaxial growth process includes following processing parameters. A reaction process temperature is controlled in a range of approximately 500° C. to 800° C. A reaction pressure is controlled in a range of approximately 1 Torr to 100 Torr. A gas used includes a mixture of silane ($SiH_4$) and germanium hydrogen gas ($GeH_4$), and a gas flow is controlled in a range of approximately 70 sccm to 300 sccm. A reaction time is controlled in a range of approximately 3 seconds to 120 seconds.

In one embodiment, the doped source/drain layers 420 are formed in the first grooves 410 by an epitaxial growth process. When the semiconductor device is a NOMS device, the epitaxial growth process includes following processing parameters. A reaction temperature is controlled in a range of approximately 500° C. to 800° C. A reaction pressure is controlled in a range of approximately 1 Torr to 100 Torr. A gas used includes a mixture of silane ($SiH_4$) and phosphine gas ($PH_3$), and a gas flow is controlled in a range of approximately 70 sccm to 300 sccm. A reaction time is controlled in the range of approximately 3 seconds to 120 seconds.

Figure 27:
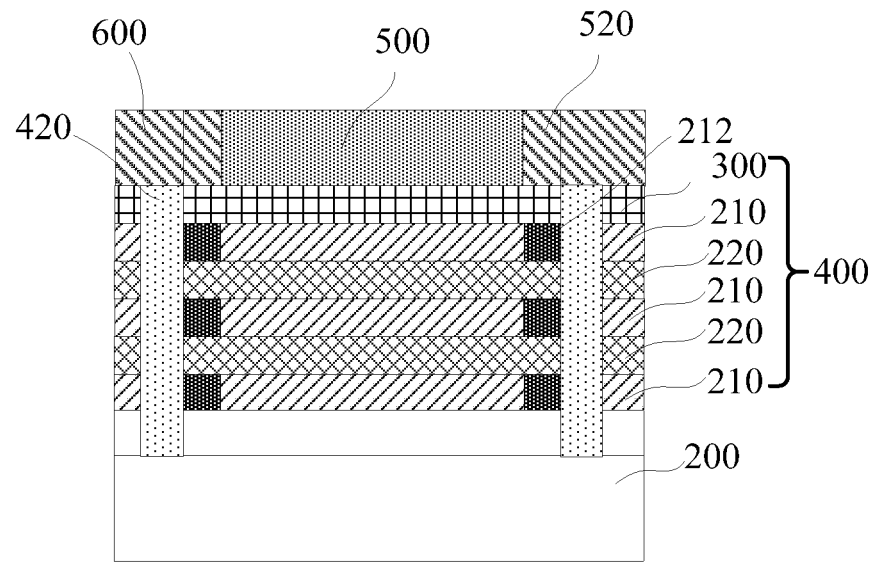

Returning to FIG. 36, after the doped source/drain layers are formed, a dielectric layer 600 may be formed on the substrate (S306). FIG. 27 illustrates a corresponding semiconductor structure.

Referring to FIG. 27, a dielectric layer 600 is formed on the substrate 200. The dielectric layer 600 covers the doped source/drain layers 420, and a top surface of the dielectric layer 600 is flush with a top surface of the dummy gate structure 500.

In one embodiment, the dielectric layer 600 is made of silicon carbide. A process for forming the dielectric layer 600 includes a chemical vapor deposition process. The chemical vapor deposition process includes following processing parameters. Gases used includes hydrogen gas, HCl gas, $SiH_2Cl_2$ gas and $PH_3$ gas. A flow rate of the hydrogen gas is in a range of approximately 2,000 sccm to 20,000 sccm. A flow rate of the HCl gas is in a range of approximately 30 sccm to 150 sccm. A flow rate of the $SiH_2Cl_2$ gas is in a range of approximately 50 sccm to 1,000 sccm. A flow rate of the $PH_3$ gas is in a range of approximately 10 sccm to 2,000 sccm. A chamber pressure is in a range of approximately 10 Torr to 600 Torr, and a chamber temperature is in a range of approximately 650° C. to 850° C.

Figure 28:
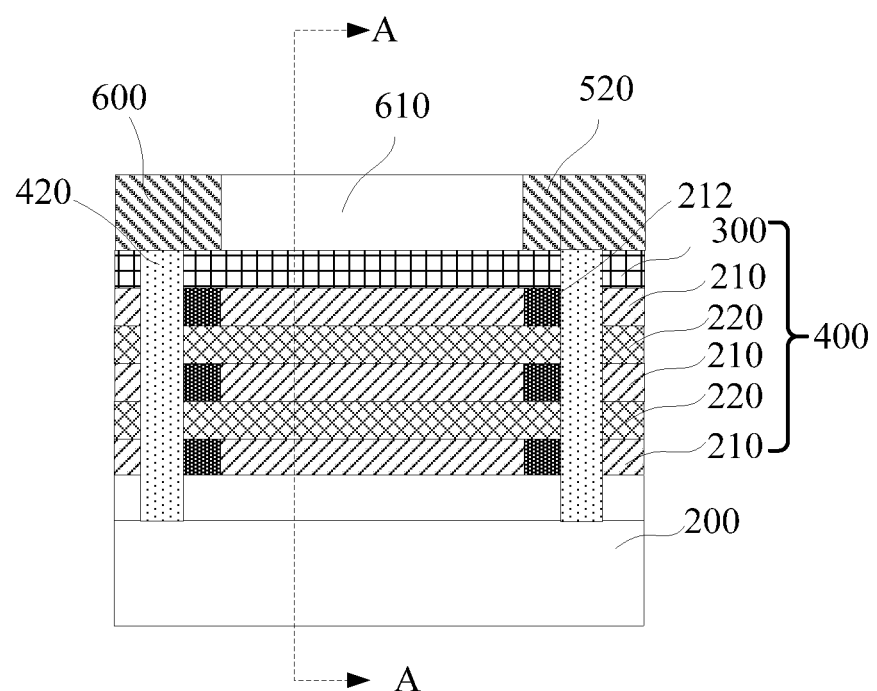
Figure 29:
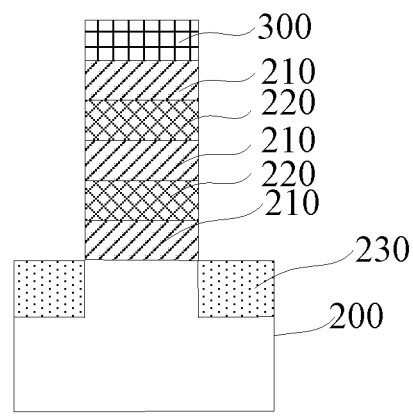

Returning to FIG. 36, after the dielectric layer is formed, the dummy gate structure may be removed until a top surface of the hard mask layer is exposed, and a trench may thus be formed in the dielectric layer (S307). FIGS. 28 to 29 illustrate a corresponding semiconductor structure. FIG. 29 is a cross-sectional view of FIG. 28 along the line A-A.

Referring to FIGS. 28 to 29, the dummy gate structure 500 is removed until a top surface of the hard mask layer 300 is exposed, and a trench 610 is thus formed in the dielectric layer 600.

In one embodiment, a wet etching process is used to remove the dummy gate structure 500. The wet etching process uses tetramethylammonium hydroxide (TMAH) as an etching solution to remove the dummy gate structure 500.

Figure 30:
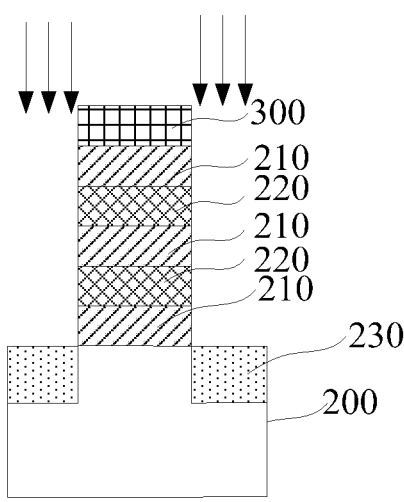

Returning to FIG. 36, after the trench in the dielectric layer is formed, ion implantation processing may be performed on the substrate (S308). FIG. 30 illustrates a corresponding semiconductor structure.

Referring to FIG. 30, ion implantation processing is performed on the substrate 200. Arrows in FIG. 30 indicate a direction of ion implantation. In one embodiment, a purpose of ion implantation on the surface of the substrate 200, before removing the sacrificial layers, is to reduce formation of parasitic MOS transistors.

In one embodiment, when the semiconductor device to be formed is a PMOS device, ions used in the ion implantation processing are N-type ions. When the semiconductor device to be formed is an NMOS device, the ions used in the ion implantation processing are P-type ions. The N-type ions may be boron ions, and the P-type ions may be phosphorus ions. Energy of ion implantation may be less than approximately 5 KeV, and a dose of ion implantation may be greater than approximately $5.0E14$ atoms/$cm^2$.

Figure 31:
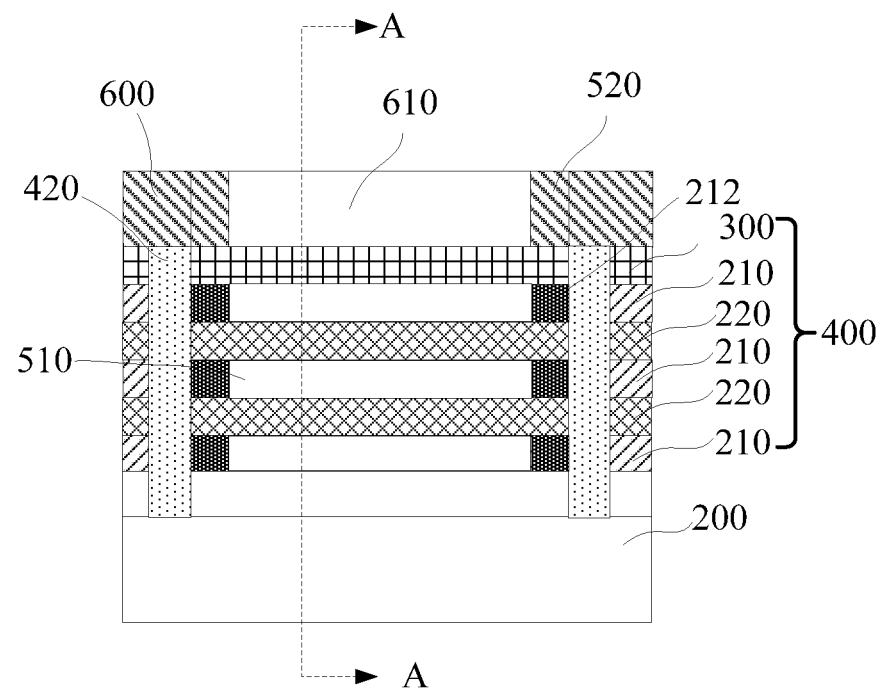
Figure 32:
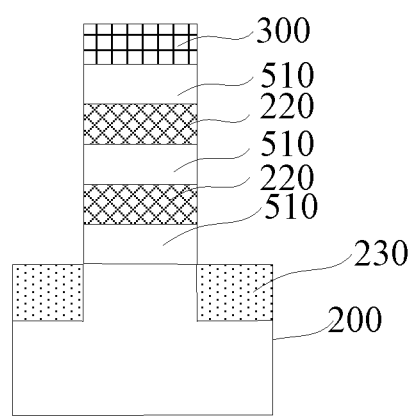

Returning to FIG. 36, after the ion implantation processing is performed, the sacrificial layers under the dummy gate structure may be removed, and tunnels may thus be formed (S309). FIGS. 31 to 32 illustrate a corresponding semiconductor structure. FIG. 32 is a sectional view of FIG. 31 along the line A-A.

Referring to FIGS. 31 to 32, the sacrificial layers 210 under the dummy gate structure 500 are removed, and tunnels 510 are thus formed.

Figure 33:
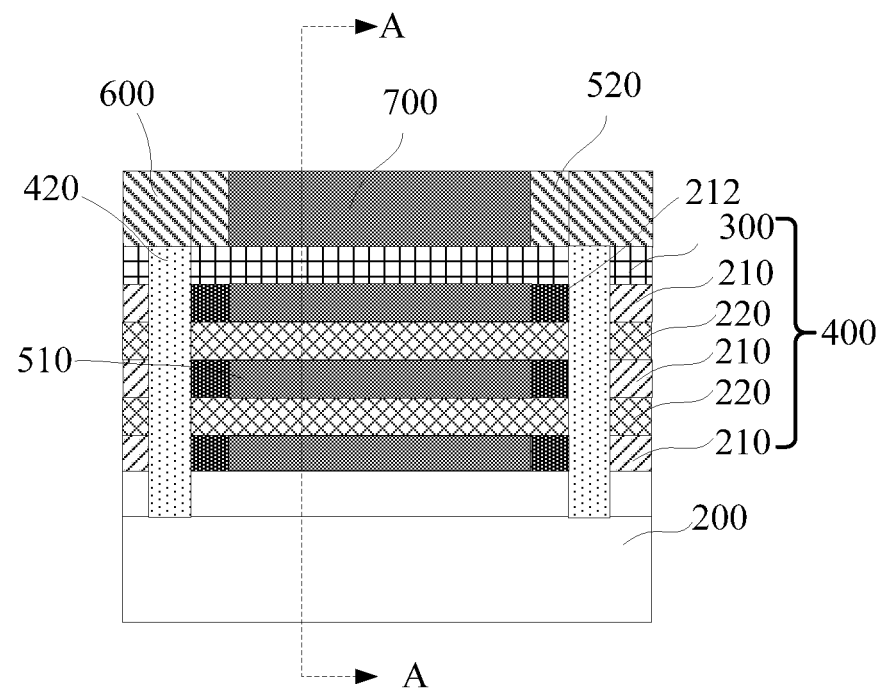
Figure 34:
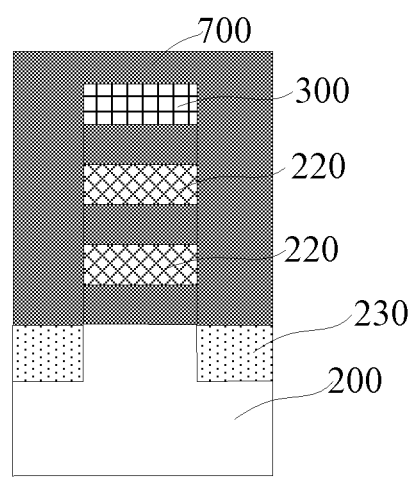

Returning to FIG. 36, after the tunnels are formed, a metal gate structure may be formed on the substrate (S310). FIGS. 33 to 34 illustrate a corresponding semiconductor structure. FIG. 34 is a cross-sectional view of FIG. 33 along the line A-A.

Referring to FIGS. 33 to 34, a metal gate structure 700 is formed on the substrate 200. The metal gate structure 700 is filled in the trench 610 and the tunnels 510, and the metal gate structure 700 surrounds the liner layers 220.

The present disclosure also provides a semiconductor device. The semiconductor device includes a substrate 200 and a plurality of fins 400 arranged separately on the substrate 200. Each fin of the plurality of fins 400 includes at least two sacrificial layers 210 on the substrate 200, a liner layer 220 between the sacrificial layers 210, and a hard mask layer 300 on the top sacrificial layer. The semiconductor device also includes an isolation structure 230 located on the substrate 200 and covering a part of sidewalls of the fins 400, and a metal gate structure 700 located on the substrate 200 and spanning the plurality of fins 400. The semiconductor device also includes side walls 520 located on sidewalls of the metal gate structure 700. The semiconductor device also includes tunnels 510 under the metal gate structure 700. The tunnels 510 are located between the substrate 200 and the liner layer 220, between adjacent liner layers 220, and between the liner layer 220 and the hard mask layer 300. The metal gate structure 700 fills the tunnels 510 and surrounds the liner layers 220. The semiconductor device also includes first grooves 410 located in the fins 400 on two sides of the metal gate structure 700, and doped source/drain layers 420 filled in the first grooves 410. The semiconductor device also includes a dielectric layer 600 located on the substrate 200 and covering the doped source/drain layers 420. A top surface of the dielectric layer 600 is flush with a top surface of the metal gate structure 700. The semiconductor device also includes second grooves 211 located in the sacrificial layers 210 under the metal gate structure 700, and inner walls 212 located in the second grooves 211.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A method for forming a semiconductor device, comprising:
   providing a substrate;
   sequentially forming at least two sacrificial layers on the substrate, and forming a liner layer between any adjacent sacrificial layers of the at least two sacrificial layers;
   forming a hard mask layer on a top layer of the at least two sacrificial layers;
   sequentially etching the hard mask layer, the at least two sacrificial layers, the liner layer, and a portion of the substrate, thereby forming a plurality of fins that are discretely arranged on a remaining portion of the substrate;
   forming a dummy gate structure across the plurality of fins on the remaining portion of the substrate; and
   removing a portion of the at least two sacrificial layers under the dummy gate structure, thereby forming tunnels, wherein the tunnels include a top tunnel between the hard mask layer and the liner layers.

2. The method according to claim 1, wherein:
   the hard mask layer is made of a material including silicon nitride, silicon oxide, silicon oxynitride, silicon carbide, silicon carbonitride, or a combination thereof.

3. The method according to claim 1, wherein:
   the hard mask layer is formed by a chemical vapor deposition process, an atomic layer deposition process, a physical vapor deposition process, or a combination thereof.

4. The method according to claim 1, wherein:
   the at least two sacrificial layers are made of a material including silicon, germanium, silicon germanium, gallium arsenide, or a combination thereof.

5. The method according to claim 1, wherein:
   the liner layer is made of a material including silicon, germanium, silicon germanium, gallium arsenide, or a combination thereof.

6. The method according to claim 1, after forming the tunnels, further comprising:
   forming a metal gate structure on the remaining portion of the substrate, wherein:
   the metal gate structure fills the tunnels; and
   the metal gate structure surrounds the liner layer and the hard mask layer.

7. A method for forming a semiconductor device, comprising:
   providing a substrate;
   sequentially forming at least two sacrificial layers on the substrate, and forming a liner layer between any adjacent sacrificial layers of the at least two sacrificial layers;
   forming a hard mask layer on a top layer of the at least two sacrificial layers;
   sequentially etching the hard mask layer, the at least two sacrificial layers, the liner layer, and a portion of the substrate, thereby forming a plurality of fins that are discretely arranged on a remaining portion of the substrate;
   forming a dummy gate structure across the plurality of fins on the remaining portion of the substrate; and
   removing a portion of the at least two sacrificial layers under the dummy gate structure, thereby forming tunnels, after forming the dummy gate structure and before removing the at least two sacrificial layers, further comprising:
   etching the plurality of fins on two sides of the dummy gate structure by using a first etching process, thereby forming first grooves in each of the plurality of fins; and
   forming doped source/drain layers in the first grooves.

8. The method according to claim 7, before forming the doped source/drain layers, further comprising:
   forming sidewall spacers on sidewalls of the dummy gate structure.

9. The method according to claim 8, after forming the first grooves and before forming the doped source/drain layers, further comprising:
   etching a portion of the at least two sacrificial layers covered by the sidewall spacers by using a second etching process, thereby forming second grooves in the at least two sacrificial layers.

10. The method according to claim 9, further comprising: forming inner walls in the second grooves.

11. The method according to claim 9, wherein: the second etching process includes a wet etching process.

12. The method according to claim 6, wherein: the first etching process includes a dry etching process.

13. The method according to claim 6, wherein removing the portion of the at least two sacrificial layers under the dummy gate structure comprises:
   removing the dummy gate structure; and
   removing the portion of the at least two sacrificial layers under the dummy gate structure.

14. The method according to claim 13, before removing the portion of the at least two sacrificial layers under the dummy gate structure, further comprising:
   performing ion implantation processing on the remaining portion of the substrate.

15. The method according to claim 13, before removing the dummy gate structure, further comprising:
   forming a dielectric layer on the remaining portion of the substrate, wherein the dielectric layer covers the doped source/drain layers, and a top surface of the dielectric layer is flush with a top surface of the dummy gate structure.

16. A semiconductor device, comprising:
   a substrate;
   a plurality of fins, discretely arranged on the substrate, wherein each fin of the plurality of fins includes a metal gate structure and a plurality of layers, wherein:
      the metal gate structure is formed between adjacent layers of the plurality of layers and surrounds each layer of the plurality of layers,
      the plurality of layers includes one or more liner layers and a hard mask layer formed over the one or more liner layers; and
   doped source/drain layers, formed in each fin and on sidewalls of the one or more liner layers and the hard mask layer, wherein a portion of the hard mask layer between the doped source/drain layers has four sides surrounded by the metal gate structure.

17. The semiconductor device according to claim 16, further comprising:
   a dielectric layer formed over the doped source/drain layers, wherein a portion of the metal gate structure is formed through the dielectric layer and over the hard mask layer.

18. The semiconductor device according to claim 17, further comprising:
   a sidewall spacer, formed over the hard mask layer and between the dielectric layer and the portion of the metal gate structure over the hard mask layer, wherein a top surface of the sidewall spacer is flush with a top surface of the metal gate structure.

19. The semiconductor device according to claim 16, further comprising:
   an isolation structure, formed on the substrate and covering a portion of sidewalls of the plurality of fins.

20. The semiconductor device according to claim 16, further comprising:
   inner walls, formed between the doped source/drain layers and portions of the metal gate structure in a direction parallel with a top surface of the substrate.

* * * * *